United States Patent [19]

Berry et al.

[11] Patent Number: 5,314,866

[45] Date of Patent: May 24, 1994

[54] FORMATION OF SUPERCONDUCTING BI-SR-CA-CU-O FILMS BY ORGANOMETALLIC CHEMICAL VAPOR DEPOSITION

[75] Inventors: Alan D. Berry, Springfield; David K. Gaskill; Ronald T. Holm, both of Alexandria; Edward J. Cukauskas, Vienna; Raphael Kaplan, Arlington, all of Va.; Richard L. Henry, Fort Washington, Md.

[73] Assignee: The United States of America as represented by the Secretary of the Navy, Washington, D.C.

[21] Appl. No.: 352,325

[22] Filed: May 16, 1989

[51] Int. Cl.$^5$ .......................... C23C 16/00; B05D 5/12
[52] U.S. Cl. .................................. 505/447; 505/734; 505/730; 505/742; 427/62; 427/255.3; 427/255.2; 427/255.1; 427/126.3
[58] Field of Search ................ 427/62, 63, 248.1, 255, 427/255.1, 255.2, 255.3, 126.3; 505/1, 734, 818, 742, 819, 730

[56] References Cited

U.S. PATENT DOCUMENTS

| 3,894,164 | 7/1975 | Dismukes et al. | 427/70 |
| 4,501,602 | 2/1985 | Miller et al. | 427/255 |
| 4,507,643 | 3/1985 | Sunano et al. | 338/34 |

FOREIGN PATENT DOCUMENTS 0055459  7/1982  European Pat. Off. .

OTHER PUBLICATIONS

Berry et al., "Growth of Superconducting Thin Films of Bismuth-Strontium-Calcium-Copper Oxide by Organometallic Chemical Vapor Deposition", Journal of Crystal Growth 92 (1988) pp. 344-347.
Zhang et al., "Organometallic Chemical Vapor Deposition of High Tc Superconducting Bi-Sr-Ca-Cu-O Films", Appl. Phys. Lett. 54(12) Mar. 1989 pp. 1166-1168.
Nagao et al., "Growth and Characterization of $Bi_{12}SiO_{20}$ Films by Metalorganic Chemical Vapor Deposition" IEEE Journal of Quantum Electronics, vol. QE-23, No. 12, Dec. 1987 pp. 2152-2158.
A. D. Berry et al., "Formation of High $T_c$Superconducting Films by Organometallic Chemical Vapor Deposition" Extended Abstract from a Poster Session During the Apr. 5 through 9, 1988 Symposium on High Temperature Superconductors II, Reno, Nevada, pp. 141-143.
Nakamori et al. "Superconducting Y-Ba-Cu-O Oxide Films by OMCVD" Jpn. J. Appl. Phys. 27(7) Jul. 1988 L1265-1267.
Tsuruoka et al. "Characteristics of Quenched Y-Ba-Cu-O Thin Films on $SrTiO_3$ (100), (110) Grown by Organometallic Chemical Vapor Deposition" Appl. Phys. Lett. 54(18) May 1, 1989 pp. 1808-1809.
Oda et al. "Epitaxial Growth of YBaCuO, Films on Sapphire at 500° C. by Metalorganic Chemical Vapor Deposition" Jpn. J. Appl. Phys. 28(3) Mar. 1989 L427-429.

(List continued on next page.)

Primary Examiner—Roy King
Attorney, Agent, or Firm—Thomas E. McDonnell; Barry A. Edelberg; David Spevack

[57] ABSTRACT

A CVD process for forming a layer or layers of superconducting materials on a semiconductor substrate in which volatile organometallic compounds of bismuth, strontium, calcium and copper are heated in the presence of a carrier gas in a first chamber free of hydrolyzing agents. Under conditions free of hydrolyzing agents, the carrier gas transports a predetermined quantity of the volatile organometallic compounds of the bismuth, strontium, calcium and copper to a deposition chamber. The compounds are decomposed and deposit mixed oxides on the substrate. Subsequent to deposition of the mixed oxides of the desired elements the layer is sintered in an oxygen-rich atmosphere, and formed into a superconducting film by subsequent slow cooling still in an oxygen-rich atmosphere.

2 Claims, 6 Drawing Sheets

OTHER PUBLICATIONS

Yamane et al. "Y-Ba-Cu-O Superconducting Films Prepared on $SrTiO_3$ Substrates by Chemical Vapor Deposition" Appl. Phys. Lett. 53(16) Oct. 1988 pp. 1548-1550.

Yamane et al. "Formation of Bismuth Strontium Calcium Copper Oxide Superconducting Films by Chemical Vapor Deposition" Jpn. J. Appl. Phys. 27(8) Aug. 1988 L1495-1497.

Lee et al. "Preparation of Y-Ba-Cu-O Thin Films on MgO by dc Magnetron Sputtering from a Stoichiometric $Y_1Ba_2Cu_3O_{7-8}$ Target" Appl. Phys. Lett., 5(15) Oct. 1987 pp. 1194-1196.

Adachi et al. "Preparation and Properties of Superconducting Bi-Sr-Ca-Cu-O Thin Films" Jpn. J. Appl. Phys. 27(4) Apr. 1988 L643-645.

H. Prakash, "Thin Film Studies of Oxides by the Organometallic-CVD Technique", Prog. Crystal Growth and Charact. 1983, vol. 6, pp. 371-391.

FORMATION OF SUPERCONDUCTING BI-SR-CA-CU-O FILMS BY ORGANOMETALLIC CHEMICAL VAPOR DEPOSITION

BACKGROUND OF THE INVENTION

1. Field of the Invention

This invention relates to a method of forming high $T_c$ superconducting films by organometallic chemical vapor deposition. More specifically, this invention relates to a method of forming superconducting films on a semiconductor surface by chemical vapor deposition of volatile organometallic compounds of the rare earth and alkaline earth elements, and copper.

2. Description of Prior Art

The discovery of high temperature superconductivity in ceramic oxides with the perovskite structure has generated considerable research in fabricating thin films of these materials by a variety of techniques. The synthesis of bulk powder samples of ceramic metal oxides that are superconducting, such as $YBa_2Cu_3O_{6.5}$, has been accomplished by heating stoichiometric mixtures of the individual metal oxides. The resulting powders, however, are not suitable for forming thin films of material that might be used in electronic devices.

Several techniques have been proposed for making thin films of superconducting materials on a substrate including spray pyrolysis, sputtering, evaporation, laser ablation, and spin coating. See R. B. Laibowitz, R. H. Koch, P. Chaudhari, and R. J. Gambino, *Phys. Rev. B.* 35, 8821 (1987); M. Hong, S. H. Liou, J. Kwo, and B. Davidson, *Appl. Phys. Lett.*, 51, 694 (1987); J. Kwo, T. C. Hsieh, R. M. Fleming, M. Hong, S. H. Liou, B. A. Davidson, and L. C. Feldman, *Phys. Rev. B,* 36, 4039 (1987); X. D. Wu, D. Dijkkamp, S. B. Ogale, A. Inam, E. W. Chase, P. F. Miceli, C. C. Chang, J M. Tarascon, and T. Venkatesan, *Appl. Phys. Lett.,* 51, 861 (1987); A. H. Hamdi, J. V. Mantese, A. L. Micheli, R. C. O. Laugal, D. F. Dungan, Z. H. Zhang, and K. R. Padmanabhan, *Appl. Phys. Lett.,* 51, 2152 (1987); A. Gupta, G. Koren, E. A. Giess, N. R. Moore, E. J. M. O'Sullivan, and E. I. Cooper, *Appl. Phys. Lett.,* 52, 163 (1988). These materials show promise for use in both large and small scale applications if a process is developed for depositing this class of superconductors on a variety of substrate geometries compatible with state-of-the-art semiconductor growth and processing techniques.

Chemical Vapor Deposition (CVD) processes have been used to make semiconductors. A matter of primary concern in a CVD process is the selection of precursors with suitable transport properties. In the case of metal oxide films, metal alkoxides, $M(OR)_x$, and metal $\beta$-diketonates, $M(RCOCHCOR)_x$, are known to have volatility. H. Prakash, *Prog. Crystal Growth and Charact.*, 6, 371 (1983). The alkoxides are recognized to be moisture sensitive. The copper precursor, copper acetylacetonate, $Cu(CH_3COCHCOCH_3)_2$, is known to be commercially available. Its transport properties are not well understood, but there is at least one report of its use in the growth of CuO films. L. A. Ryabova, *Current Topics in Material Science,* Vol. 7, edited by E. Kaldis (North-Holland, Amsterdam, 1981), pp. 598-642. The corresponding yttrium acetylacetonate is reported to be nonvolatile, whereas other yttrium chelates with fluorinated and non-fluorinated groups substituted in the 1 and 3 positions of the $\beta$-diketone ligand are described as volatile. E. W. Berg and J. J. Chiang Acosta, *Anal. Chim. Acta,* 40, 101 (1968)

At page 141-143 of the *Extended Abstracts, High-Temperature Superconductors II,* edited by Capone et al. and distributed Apr. 5-9 1988, at the Symposium Support Department of Energy Division of Material Science, at Reno, Nev., Berry et al. disclosed a formation of High $T_c$ superconducting films by organometallic chemical vapor deposition (OMCVD) utilizing $\beta$-diketonates. About May 26, 1988, Nakamori, Abe, Kanamori, and Shibata distributed a paper directed to the same subject matter. Nakamori et al. noted problems with the stability of the $\beta$-diketone chelate and with converting the films to superconductors. Nakamori et al. suggested trying the fluorinated analogs.

The diketone chelates are known to hydrolyze upon heating. Charles et al., *J. Inorg. Nucl. Chem.*, 26, pp. 373-376, (1964); Springe et al., *Inorganic Chem.*, Vol 6, #6, pp. 1105-1110, June 1967; Richardson, *Inorganic Chem.*, Vol. 10, #3, pp. 498-504 (1971); Cranley et al., *Anal. Chim.*, 60, pp. 109-116, (1972); Berg et al., *Anal. Chim.*, 60, pp. 117-125 (1972). The hydrolyzed product will block feed passages used in a CVD process if they form during transport and will not be volatile if they form before transport.

SUMMARY OF THE INVENTION

Accordingly, an object of this invention is a simple, flexible process for forming superconducting layers on a surface.

Another object of the invention is a process which will make distinct layers of superconducting materials of predetermined composition.

An additional object of this invention is a process in which the deposition parameters can be closely controlled.

Yet another object of the invention is a process in which multiple layers of superconducting and non-superconducting materials can be grown of uniform thickness and composition on a substrate.

A further object of this invention is a process which is applicable to mass production techniques.

These and additional objects of the invention are accomplished by a CVD process in which volatile organometallic compounds of a lanthanide, or lanthanide-like element (both hereinafter generically included in the term lanthanide), an alkaline earth metal, and copper are heated in the presence of a carrier gas in a first chamber free of hydrolyzing agents. The lanthanide and alkaline earth metal are of the kind known to form superconductors with copper and oxygen and include at least Y, Ba, Bi, Ca, Sr. Under conditions free of hydrolyzing agents, the carrier gas transports a predetermined quantity of the volatile organometallic compounds of the alkaline earth metal, lanthanide series element, and copper to a deposition chamber. In an oxygen-rich atmosphere, the volatile organometallic compounds are decomposed on a substrate and formed into a superconducting film by subsequent slow cooling in an oxygen-rich atmosphere. There is no need to maintain the deposition chamber free of hydrolyzing agents.

BRIEF DESCRIPTION OF THE DRAWINGS

A more complete appreciation of the invention will be rapidly obtained by reference to the following Description of The Preferred Embodiments and the accompanying drawings in which like numerals in different figures represent the same structures or elements, wherein.

DESCRIPTION OF THE PREFERRED EMBODIMENTS

In the process of the invention, at least one thin film of a superconducting composition is coated on a substrate by the steps comprising a. providing a volatile organometallic compound of at least one of the elements selected from the group consisting of Y, Ba, Ca, Sr, Cu and Bi in an atmosphere free of hydrolyzing agents;

b. flowing a carrier gas free of hydrolyzing agents over said organometallic compounds at a rate sufficient to "take up" a predetermined amount of said organometallic compounds;

c. transporting said organometallic compound under conditions free of hydrolyzing agents to a deposition chamber;

d. mixing oxygen and organometallic compounds in the deposition chamber to form an atmosphere of stoichiometrically mixed oxides of the metal elements at or near the surface of a substrate;

e. depositing the mixed oxides on the substrate;

f. sintering the mixed oxides at a temperature between about 500° C. and 900° C. to form a coated substrate;

g. slowly cooling the coated substrate at a rate not to exceed 50° C. per hour to produce a substrate coated with at least one layer of a superconductor composition.

More than one layer of superconducting material may be applied to a substrate by successively coating layers of the materials in steps a through g. Any of the known variations of CVD processes known in the fiber optic art and/or the semiconductor art can be used to apply successively varying composition layers of superconductor thin films on a substrate.

The preferred substrates are MgO, $SrTiO_3$ and yttria-stabilized $ZrO_2$. The substrate can be in any form well known for use with electronic semiconductors.

Once the layer of superconducting elements is deposited on the substrate, it is cured by heating at a temperature between 500° C. and 900° C. for at least three hours. Subsequently, the coated substrate is slowly cooled to ambient conditions at a rate of not less than 50° C. per hour.

The organometallic compounds of the superconductor elements which include Y, Ba, Cu, Ca, Sr, and Bi must be sufficiently volatile that sufficient amounts of the element can be transported to a deposition chamber for deposit in preferred and known stoichiometric quantities. It is preferred to use chelates as the volatile organometallic compounds for the elements Y, Ba, Cu, Ca, and Sr. Most preferably, the chelates are $\beta$-diketonates. For Bi, trialkyl- or triarylbismuth compounds, $R_3Bi$, are preferred. A suitable, but not air-stable, compounds is trimethylbismuth. The most preferred volatile organic compounds for bismuth is triphenylbismuth.

The organometallic compounds tend to hydrolyze. Hydrolysis reduces the ability of the compounds to volatilize in a predictable manner and therefore interferes with depositing stoichiometrically correct amounts of the compositions. It has been found that it is necessary to maintain the organometallic compound volatilization chamber and the conduits leading from the chamber to a deposition vessel free of hydrolyzing agents to keep the CVD accurate and dependable. To accomplish that, the conduits from the volatilization chamber to the deposition chamber are maintained warm and dry. Other means can be used to keep the atmosphere free of hydrolyzing agents including heating the volatilization chambers, drying carrier gas streams and the like.

Having described the invention, the following examples are given to illustrate specific applications of the invention including the best mode now known to perform the invention. These specific examples are not intended to limit the scope of the invention described in this application.

EXAMPLE 1

The copper precursor, copper acetylacetonate, $Cu(CH_3COCHCOCH_3)_2$, is commercially available. Its transport properties are not well understood but there is at least one report of its use in the growth of CuO films. L. A. Ryabova, in *Current Topics in Material Science*, Vol. 7, edited by E. Kaldis (North-Holland, Amsterdam, 1981), pp. 598–642. The corresponding yttrium acetylacetonate is reported to be nonvolatile, whereas other yttrium chelates with fluorinated and non-fluorinated groups substituted in the 1 and 3 positions of the $\beta$-diketone ligand are described as volatile. E. W. Berg and J. J. Chiang Acosta, *Anal. Chim. Acta*, 40, 101 (1968).

Because of possible undesirable side reactions from the presence of fluorine atoms, the volatile yttrium 2,2,6,6-tetramethyl-3,5-heptanedionate, $Y(CH_3C(CH_3)_2C(O)CHC(O)C(CH_3)_2CH_3)_3$, is used as the organometallic compound. The heptanedionate is synthesized according to published procedures. K. J. Eisentraut and R. E. Sievers, *J. Amer. Chem. Soc.*, 87, 5254 (1965). The selection of a volatile barium precursor is believed to be the main obstacle to success in growing these superconducting films. Although barium 2,2,6,6-tetramethyl-3,5-heptanedionate, $Ba(CH_3C(CH_3)_2C(O)CHC(O)C(CH_3)_2CH_3)_2$, is reported to be nonvolatile under certain experimental conditions, E. W. Berg and N. M. Herrera, *Anal. Chim. Acta*, 60, 117 (1972) the material sublimes between 230°–240° C. at $10^{-5}$ torr and successfully transports barium to the deposition site in our reactor. This compound was synthesized by the reaction of barium metal with the parent diketone.

The deposition is carried out at ambient pressure in a Pyrex vertical reactor. A substrate of MgO, approximately a square centimeter in size, is placed on a rotating graphite susceptor inductively heated to 400° C. Individual precursor sources and delivery lines are wrapped with heating tapes and maintained at 160° C., 253° C., and 170° C. for the Y, Ba, and Cu compounds, respectively. Nitrogen carrier gas is passed over the heated precursors at flow rates of 150 cm$^3$ min$^{-1}$ for Y and Cu, and 500 cm$^3$ min$^{-1}$ for Ba, and subsequently mixed with oxygen, which is bubbled through water at a flow rate of 1000 cm$^3$ min$^{-1}$, prior to entering the deposition chamber. It is not necessary to bubble the oxygen through water. The as-deposited films are dark brown and amorphous. They are annealed under oxygen by heating from 890° to 920° C. over a 20-minute period, holding at 920° C. for 10 minutes, cooling quickly to 650° C., and then cooling slowly (50° C. hr$^{-1}$) to ambient temperature. The dull gray annealed samples, whose thicknesses corresponded to deposition rates of approximately 8 nm min$^{-1}$, are stored in a desiccator.

Figure 1:
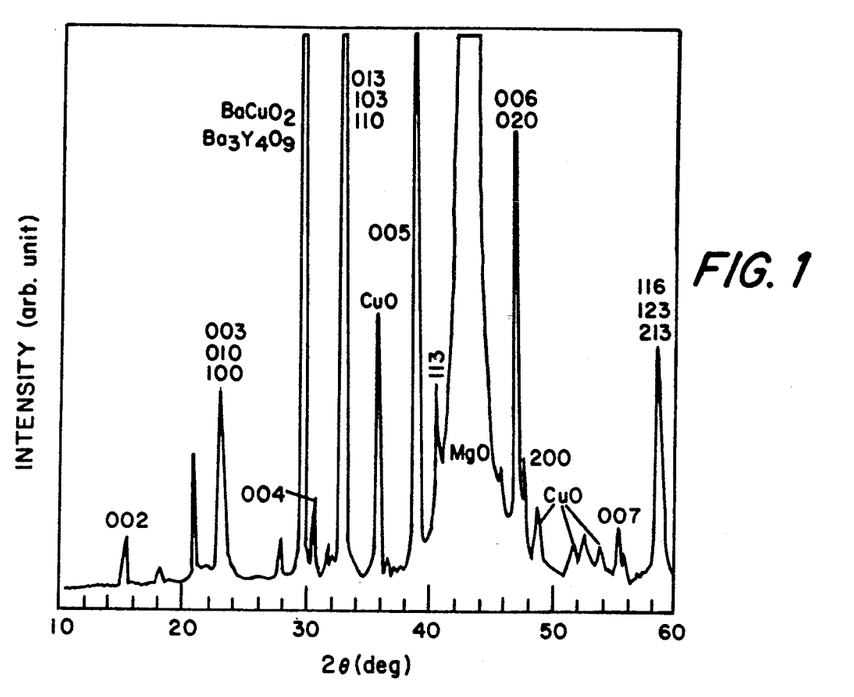
FIG. 1 is a X-ray diffraction pattern of YBaCuO film on MgO after annealing.

A typical x-ray diffraction spectrum of an annealed film is shown in FIG. 1. Relative peak intensities vary when different areas of the film are examined, indicating some inhomogeneity in the films. The (00 1) reflections with $l = 2 \ldots 7$ are all observed in the $2\Theta$ range from 10° to 60° with relative intensities comparable to those reported previously for YBaCuO films on MgO. C. L. Chien, G. Xiao, F. H. Streitz, A. Gavrin, and M. Z. Cieplak, *Appl. Phys. Lett.*, 51, 2155 (1987). The presence of CuO in the film is indicated by several weak peaks in the spectrum. In addition, a relatively strong peak at $2\Theta = 29.3°$ suggested the existence of mixed metal oxides such as BaCuO$_2$ and Ba$_3$Y$_4$O$_9$. Partially resolved groups of peaks are also observed near $2\Theta = 33°$, 47°, and 58°, where different line shapes are expected for the orthorhombic and tetragonal structures of YBaCuO. Y. LePage, W. R. McKinnon, J. M. Tarascon, L. H. Greene, G. W. Hull, and D. M. Hwang, *Phys. Rev. B*, 35, 7245 (1987) and R. M. Hazen, L. W. Finger, R. J. Angel, C. T. Prewitt, N. L. Ross, H. K. Mao, C. G. Hadidiacos, P. H. Hor, R. L. Meng, and C. W. Chu, *Phys. Rev. B*. 35, 7238 (1987). In each case, analysis of high resolution scans indicated the presence of some orthorhombic phase.

Figure 2:
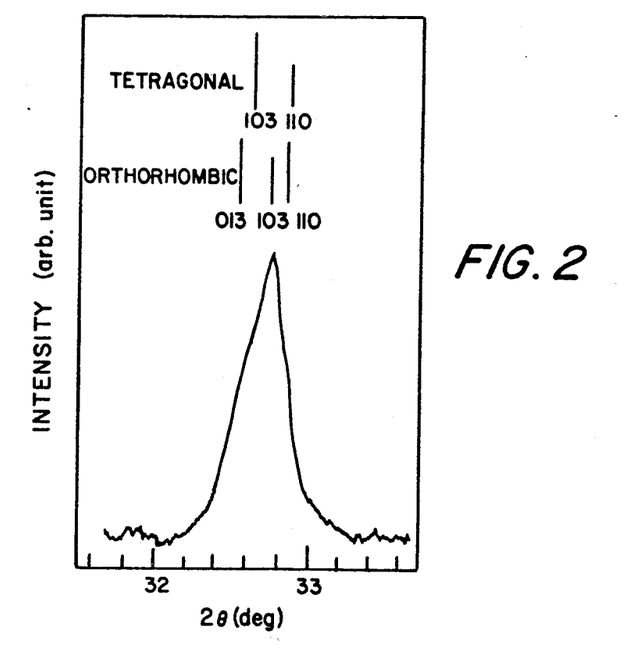
FIG. 2 is an expanded x-ray diffraction from $2\Theta=32°$ to $33°$

FIG. 2 illustrates the envelope of the (013), (103), and (110) reflections. The broadening of the near-33° envelope on the low $2\Theta$ side implies the presence of the (013) reflection, which is expected for the orthorhombic, but not for the tetragonal, phase. The envelope shape compares well with results for YBaCuO films deposited on MgO substrates by other techniques.

Figure 3:
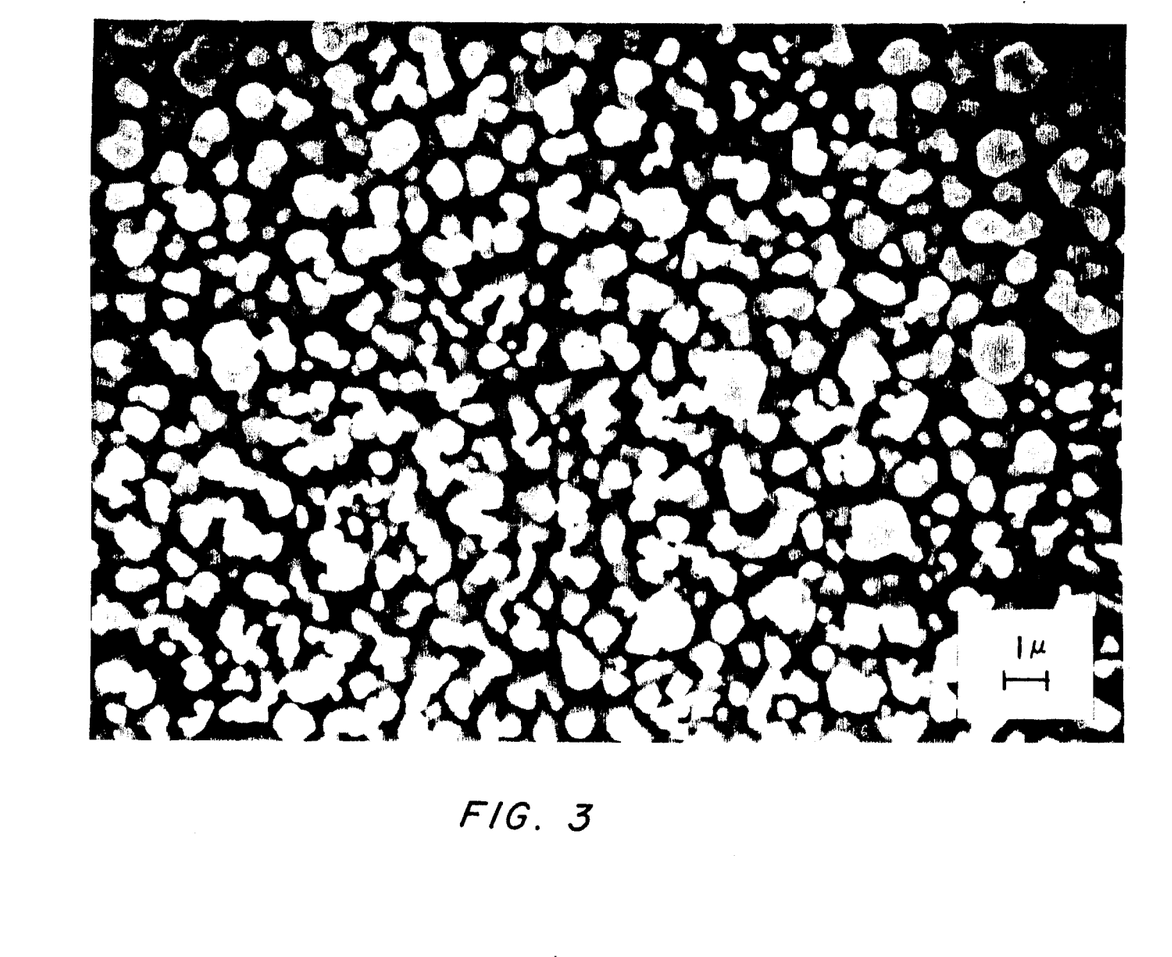
FIG. 3 is a scanning electron micrograph of YBaCuO film.

A scanning electron micrograph of the annealed film is shown in FIG. 3, revealing faceted grains 0.5 to 1.0 $\mu$m in size uniformly distributed over the surface.

Figure 4:
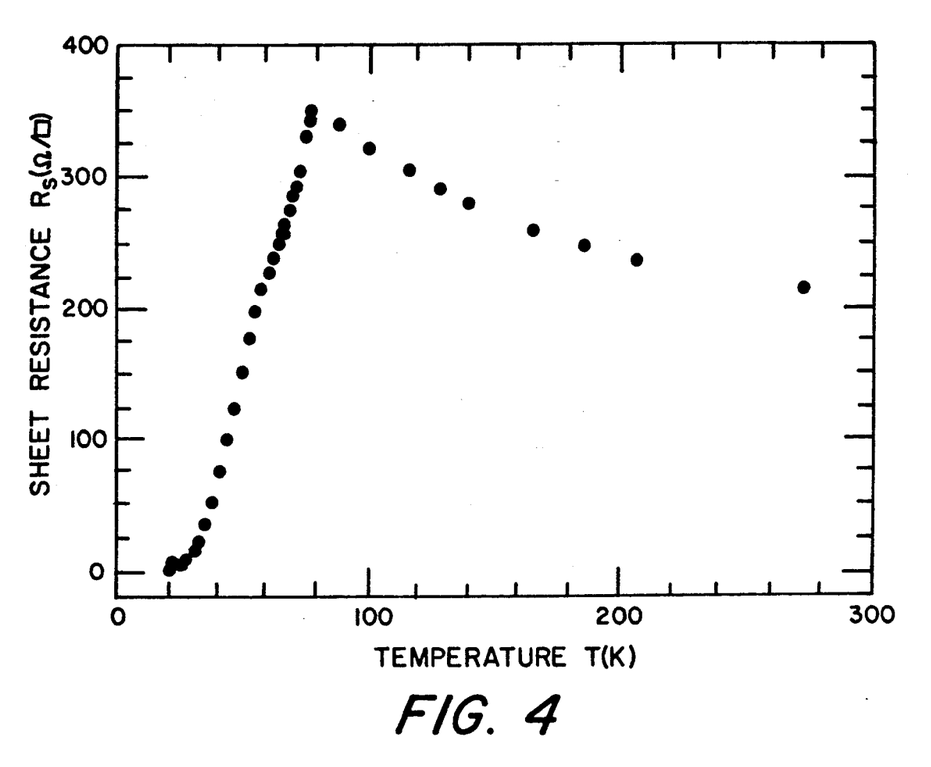
FIG. 4 is a graph of sheet resistance vs. temperature measurement of YBaCuO film.

The resistance vs. temperature is measured using a standard four-point-in-line method where contact to the film was made with indium-coated pressure contacts. A 10 $\mu$A, 100 Hz constant-current source was used to bias the sample and a Princeton Applied Research 124A lock-in amplifier was used to measure the voltage across the sample. FIG. 4 illustrates the sheet resistance vs. temperature for the sample whose x-ray diffraction spectrum is discussed above. This sample shows semiconductor-like conduction followed by a broad double resistive transition at approximately 80°K and 60°K as the temperature is lowered, with the resistance becoming zero at ~20°K. The 90% onset temperature for this sample was 75.1°K and the 10% point was 36.3°K. This type of transition can result from a mixture of two superconducting phases which are dependent upon the amount of oxygen incorporated into the film. Although one edge of the film was measured to be 950 nm by a Dektak profilometer, the overall film thickness appeared visually to be nonuniform. The measured thickness implied a resistivity of 0.035 ohm-cm at the transition onset. Such a large resistivity is consistent with the broad superconducting transition. These results indicate the presence of superconducting material in films grown by OMCVD in a very simple reactor.

EXAMPLE 2

The composition Bi-Sr-Ca-Cu-O, exhibits several attractive properties, including onset temperatures near 120°K and greater resistance to degradation caused by atmospheric exposure. The chemical precursors used in this growth are chosen not only for their transport and deposition properties, but also for their ease in handling. Copper acetylacetonate, Cu(CH$_3$C(O)CHC(O)CH$_3$)$_2$, which is used in Example 1, is also the copper source here. The betadiketonates used for the calcium and strontium precursors are the tetramethylheptanedionate analogs of the barium compound of Example 1. The compound is M(CH$_3$C(CH$_3$)$_2$C(O)CH-C(O)C(CH$_3$)$_2$CH$_3$)$_2$ where M=Ca, Sr. The volatile bismuth compound is triphenylbismuth, (C$_6$H$_5$)$_3$Bi, an air-stable solid that melts at 78°–78.5° C. and transports at 100° C. with a system pressure of 10$^{-5}$ Torr. Alternatively, other volatile sources such as trialkyl- and triarylbismuth compounds, R$_3$Bi, can be used. A suitable, but not as air-stable, compound is trimethylbismuth.

The deposition of Bi-Sr-Ca-Cu-O films is carried out at ambient pressure in the same system used in Example 1 for the Y-Ba-Cu oxides. Smooth, cleaved 1×1 cm MgO substrates are degreased with detergent and trichloroethylene prior to mounting in the growth chamber (deposition site). The substrates are placed on a rotating graphite susceptor inductively heated to 500° C. during deposition. This temperature is chosen initially with the idea that it should be high enough to decompose the precursors. Because of the similar volatilities of the calcium and strontium compounds, and in order to simplify the initial experiments, these precursors are placed in the same transport tube. Transport tubes and lines are wrapped with heating tapes and maintained at 165°, 250°, and 175° C. for the bismuth, strontium/calcium, and copper compounds, respectively. Nitrogen carrier gas is passed over the heated precursors at flow rates of 150 cm$^3$ min$^{-1}$ and mixed with oxygen, whose flow rate is 1000 cm$^3$ min$^{-1}$, prior to entering the deposition chamber. In contrast to the Y-Ba-Cu-O depositions, the oxygen was not bubbled through water, as this appeared to lead to premature decomposition of some of the precursors.

Deposition times are typically two hours, and the same deposition parameters are used in all runs in an effort to deposit films with the same composition. When removed from the reactor, the films are dark brown to black. X-ray analysis reveals several broad peaks suggesting a fine grain or amorphous character.

Figure 5A:
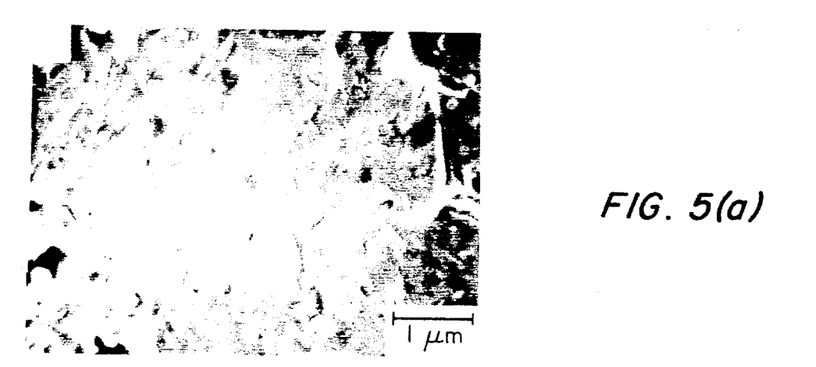
FIGS. 5(a), 5(b) and 5(c) are scanning electron micrographs for 5(a) BSCCO-9, 5(b) BSCCO-8, and 5(c) BSCCO-5.
Figure 5B:
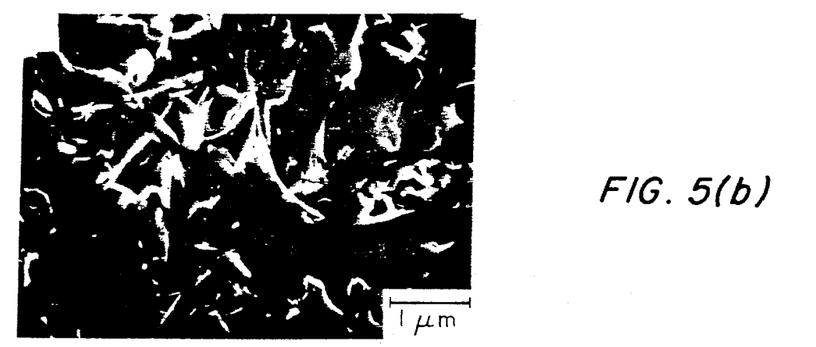
Figure 5C:
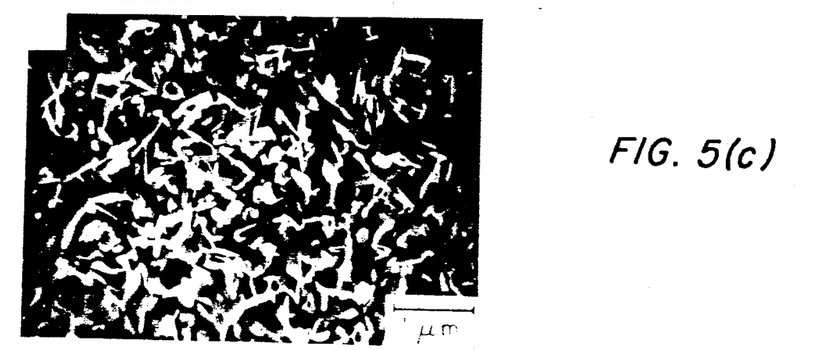
Figure 6:
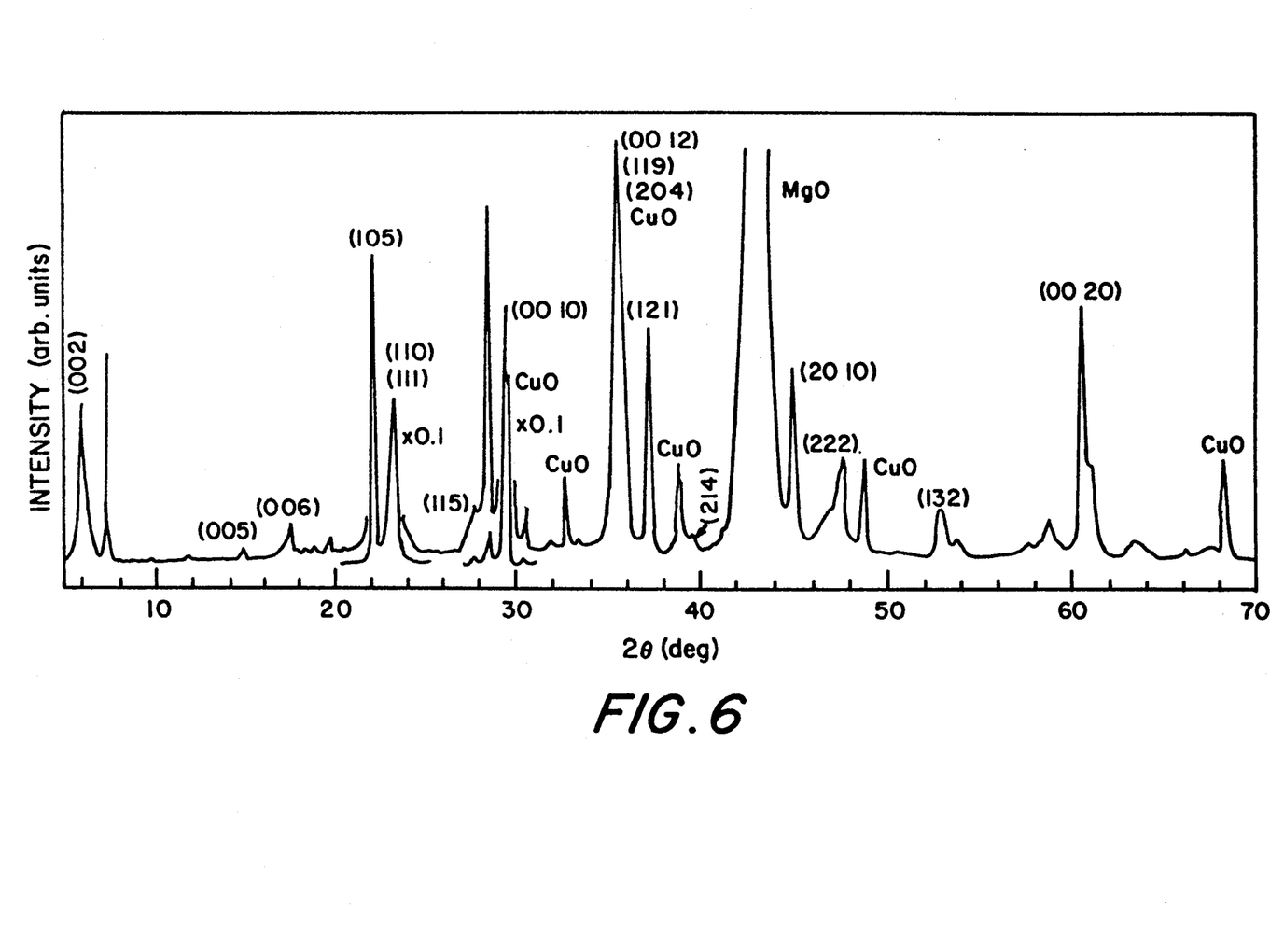
FIG. 6 is a x-ray diffraction pattern for BSCCO-9.
Figure 7:
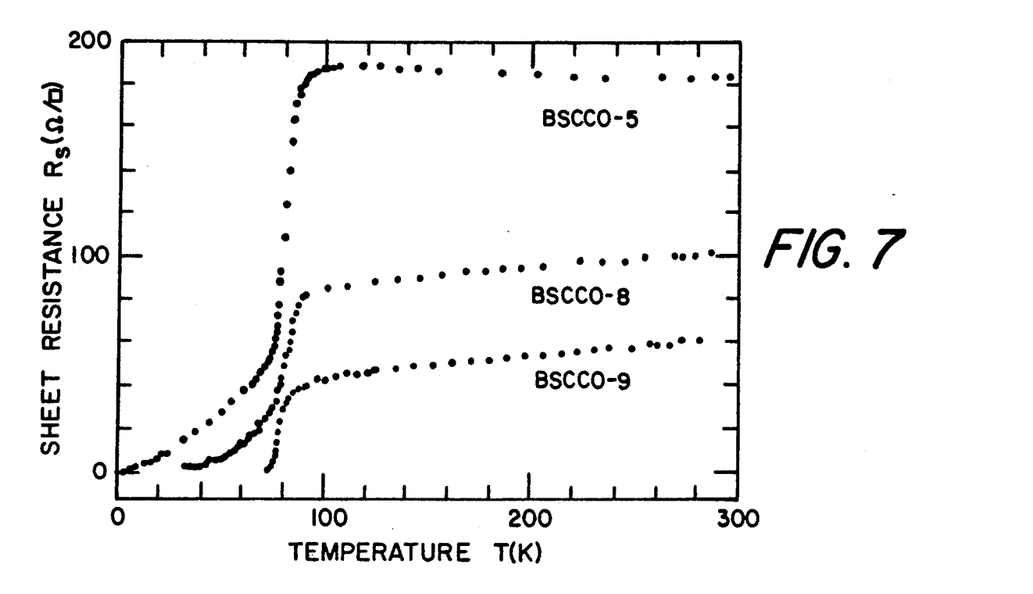
FIG. 7 is a sheet resistances vs temperature for BSCCO-9, BSCCO-8, and BSCCO-5.
Figure 8:
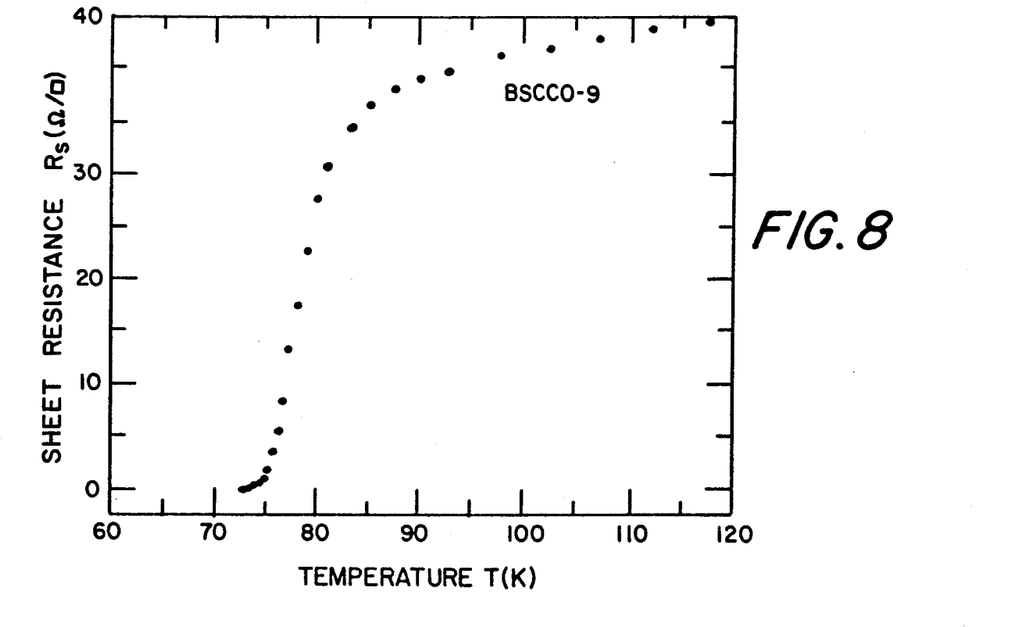
FIG. 8 is an expanded view of sheet resistances vs temperature for BSCCO-9.

There appears to be a dependence of resistance on annealing temperature and time, but it is likely that variations in film composition due to fluctuations in deposition parameters are also involved. Samples are annealed in a conventional tube furnace with an integral quartz liner. Annealing takes place under an oxygen atmosphere flowing at a rate of 150 cm$^3$ min$^{-1}$. With the furnace at the desired temperature, a quartz boat containing the sample is moved to the center of the furnace. After 10 minutes, the boat is quickly removed and left to cool under ambient conditions. Since it was difficult to measure accurately the sample temperature during annealing, the set-point of the temperature controller is reported. However, a calibration experiment indicated that the actual sample temperature is approximately 30° C. lower than this. The set-point temperatures for the samples were 884° C. (BSCCO-5), 890° C. (BSCCO-8), and 887° C. (BSCCO-9). Annealed samples are dark gray and have thicknesses ranging from 0.95 to 1.25 microns as determined by profilometer measurements. Electron micrographs for BSCCO 9, 8, and 5 are shown in FIGS. 5a, b, and c respectively. FIG. 6 is an x-ray diffraction pattern for BSCCO-9. FIG. 7 is a graph of sheet resistances vs temperature for BSCCO-9, 8, and 5. FIG. 8 is an expanded view for BSCCO-9.

Obviously, many modifications and variations of the present invention are possible in light of the above teachings. It is therefore to be understood that, within the scope of the appended claims, the invention may be practiced otherwise than as specifically described.

What we claim is:

1. A method of coating at least one film of a superconductor composition on a substrate comprising the steps of:
   (a) providing triphenylbismuth, strontium 2,2,6,6-tetramethyl-3,5-heptanedionate, calcium 2,2,6,6-tetramethyl-3,5-heptanedionate and copper acetylacetonate as organometallic precursors;
   (b) flowing a carrier gas free of hydrolyzing agents over said organometallic precursors at a rate sufficient to take up an amount of said organometallic precursors;
   (c) transporting said organometallic precursors under conditions free of hydrolyzing agents to a deposition chamber;
   (d) mixing oxygen and said organometallic precursors in the deposition chamber to decompose said organometallic precursors and deposit mixed oxides on said substrate
   (e) sintering the mixed oxides at a temperature between about 500° C. and 900° C. to form a coated substrate;
   (f) cooling the coated substrate to ambient temperature to produce said substrate coated with at least one said film of said superconductor composition.

2. A method of coating at least one film of a superconductor composition on a substrate comprising the steps of:
   (a) providing triphenylbismuth, a diketone chelate of Sr, a diketone chelate of Ca, and a diketone chelate of Cu as organometallic precursors;
   (b) flowing a carrier gas free of hydrolyzing agents over said organometallic precursors at a rate sufficient to take up an amount of said organometallic precursors;
   (c) transporting said organometallic precursors under conditions free of hydrolyzing agents to a deposition chamber;
   (d) mixing oxygen and said organometallic precursors in the deposition chamber to decompose said organometallic precursors and deposit mixed oxides on said substrate;
   (e) sintering the mixed oxides at a temperature between about 500° C. and 900° C. to form a coated substrate;
   (f) cooling the coated substrate to ambient temperature to produce said substrate coated with at least one said film of said superconductor composition.

* * * * *